(12) United States Patent
Su et al.

(10) Patent No.: US 9,586,815 B2
(45) Date of Patent: Mar. 7, 2017

(54) MICRO-ELECTROMECHANICAL APPARATUS WITH MULTIPLE CHAMBERS AND METHOD FOR MANUFACTURING THE SAME

(71) Applicant: Industrial Technology Research Institute, Hsinchu (TW)

(72) Inventors: Chung-Yuan Su, Taichung (TW); Chin-Fu Kuo, Tainan (TW); Tzung-Ching Lee, Hsinchu County (TW); Chao-Ta Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/588,983

(22) Filed: Jan. 5, 2015

(65) Prior Publication Data

US 2016/0137491 A1    May 19, 2016

(30) Foreign Application Priority Data

Nov. 13, 2014  (TW) .............................. 103139411 A

(51) Int. Cl.
  *B81B 7/02*        (2006.01)
  *B81C 1/00*        (2006.01)
(52) U.S. Cl.
  CPC ........ *B81B 7/02* (2013.01); *B81B 2201/0235* (2013.01); *B81B 2201/0242* (2013.01); *B81B 2201/0264* (2013.01); *B81B 2203/0127* (2013.01); *B81B 2203/04* (2013.01); *B81C 2203/0109* (2013.01)

(58) Field of Classification Search
  None
  See application file for complete search history.

(56) References Cited

U.S. PATENT DOCUMENTS

| 7,150,195 | B2 | 12/2006 | Jacobsen et al. |
| 7,518,493 | B2 | 4/2009 | Bryzek et al. |
| 8,216,882 | B2 | 7/2012 | Lin et al. |
| 8,220,330 | B2 | 7/2012 | Miller et al. |
| 8,316,718 | B2 | 11/2012 | Lin et al. |

(Continued)

FOREIGN PATENT DOCUMENTS

| CN | 102401706 | 4/2012 |
| EP | 2431722 | 3/2012 |

(Continued)

OTHER PUBLICATIONS

"Office Action of Taiwan Counterpart Application," issued on May 6, 2015, p. 1-p. 10.

(Continued)

*Primary Examiner* — Khaja Ahmad
(74) *Attorney, Agent, or Firm* — Jianq Chyun IP Office

(57) ABSTRACT

A micro-electromechanical apparatus with multiple chambers and a method for manufacturing the same are provided, wherein various micro-electromechanical sensors are integrated into a single apparatus. For example, the micro-electromechanical apparatus in this disclosure may have two independent hermetically sealed chambers with different pressures, such that a micro-electromechanical barometer and a micro-electromechanical accelerometer can be operated in an optimal pressure circumstance.

34 Claims, 11 Drawing Sheets

(56) References Cited

U.S. PATENT DOCUMENTS

| | | | |
|---|---|---|---|
| 8,350,346 B1 | 1/2013 | Huang et al. | |
| 8,387,464 B2 | 3/2013 | McNeil et al. | |
| 8,468,888 B2 | 6/2013 | Wu et al. | |
| 8,487,387 B2 | 7/2013 | Lin et al. | |
| 8,607,638 B2 | 12/2013 | Jeung et al. | |
| 8,637,943 B1 | 1/2014 | Yang | |
| 2006/0237806 A1* | 10/2006 | Martin | H04R 3/00 257/415 |
| 2008/0128901 A1* | 6/2008 | Zurcher | B81C 1/00238 257/724 |
| 2008/0247585 A1* | 10/2008 | Leidl | B81B 7/0061 381/360 |
| 2011/0027930 A1* | 2/2011 | El-Gamal | B81C 1/00301 438/51 |
| 2011/0126632 A1* | 6/2011 | McNeil | B81B 7/02 73/718 |
| 2012/0260747 A1* | 10/2012 | Chen | G01L 19/0092 73/863 |
| 2013/0205899 A1 | 8/2013 | Wu et al. | |
| 2013/0283912 A1 | 10/2013 | Lin | |
| 2014/0008738 A1 | 1/2014 | Morris, III et al. | |

FOREIGN PATENT DOCUMENTS

| | | |
|---|---|---|
| TW | I414478 | 11/2013 |
| TW | 201402451 | 1/2014 |

OTHER PUBLICATIONS

Cheng-Hsiang Liu, et al., "Adaptable and Integrated Packaging Platform for MEMS-based Combo Sensors utilizing Innovative Wafer-Level Packaging Technologies," Electronic Components and Technology Conference (ECTC), 2013 IEEE 63rd, May 2013,, pp. 1675-1681.

W.-C. Yeh, et al., "Novel TPMS Sensing Chip With Pressure Sensor Embedded in Accelerometer," Solid-State Sensors, Actuators and Microsystems (Transducers & Eurosensors XXVII), 2013 Transducers & Eurosensors XXVII: The 17th International Conference on, Jun. 16-20, 2013, pp. 1759-1762.

Chih-Ming Sun, et al., "Monolithic integration of capacitive sensors using a double-side CMOS MEMS post process," Journal of Micromechanics and Microengineering, Dec. 10, 2008, pp. 1-9.

Xu Jingbo, et al., "A monolithic silicon multi-sensor for measuring three-axis acceleration, pressure and temperature," Journal of Mechanical Science and Technology, vol. 22, Apr. 2008, pp. 731-739.

Zao Ni, et al., "Monolithic Composite "Pressure + Acceleration + Temperature + Infrared" Sensor Using a Versatile Single-Sided "SiN/Poly-Si/Al" Process-Module," Sensors, vol. 13, Jan. 16, 2013, pp. 1085-1101.

* cited by examiner

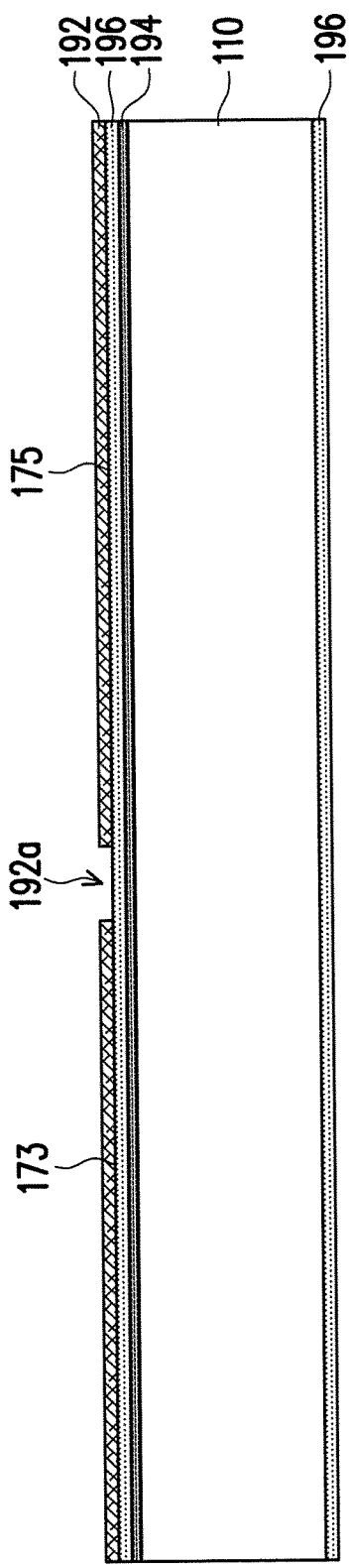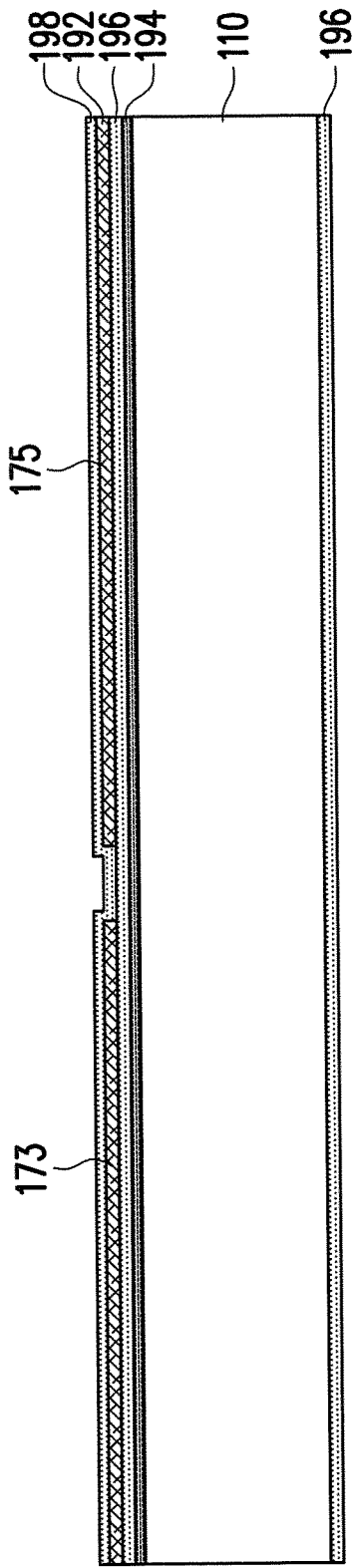

MICRO-ELECTROMECHANICAL APPARATUS WITH MULTIPLE CHAMBERS AND METHOD FOR MANUFACTURING THE SAME

CROSS-REFERENCE TO RELATED APPLICATION

This application claims the priority benefit of Taiwan application serial no. 103139411, filed on Nov. 13, 2014. The entirety of the above-mentioned patent application is hereby incorporated by reference herein and made a part of this specification.

TECHNICAL FIELD

The disclosure is related to an integrated micro-electromechanical apparatus having multiple hermetically sealed chambers and a method for manufacturing the same.

BACKGROUND

In general, sensing elements of micro-electromechanical sensors are required to be operated in a specific circumstance to achieve desired optimal performance. Thus, operating circumstances of the sensing elements are adaptable to meet different functions of the micro-electromechanical sensors to ensure a high sensing accuracy. For example, for some micro-electromechanical sensors (e.g., a gyroscope), a damping effect to the vibration frequency and noise-to-signal ratio need to be considered. Hence, the sensing elements (e.g., a movable mass in the gyroscope) thereof are disposed in a vacuum hermetically sealed chamber to reduce the effect of air damping. Some other sensing elements (e.g., a movable mass in an accelerometer) requires appropriate air damping when vibration is generated during measurement of acceleration, so as to obtain correct results. Therefore, the sensing elements (e.g., the movable mass of the accelerometer) thereof need to be disposed in a hermetically sealed chamber with a specific gas pressure. Furthermore, some further sensing elements (e.g., a sensing film of a barometer need to be enclosed in a hermetically sealed chamber with a specific gas pressure or a vacuum hermetically sealed chamber, so as to measure an atmospheric pressure of the circumstance where the barometer is located.

However, owing to the requirements on smaller size and lower cost of electronic devices on the market, integration of sensors with different functions becomes a main trend in developing micro-electromechanical sensors. Thus, providing a micro-electromechanical sensor with multiple chambers to allow different sensing elements to achieve the optimal performance at different gas pressures has now become a crucial part in integrating multiple micro-electromechanical sensors.

SUMMARY

The disclosure is directed to a hermetically sealed type integrated micro-electromechanical apparatus that integrates micro-electromechanical sensing elements having different functions to measure different physical quantities, such as pressure or inertia, simultaneously. Taking a barometer and an accelerometer for instance, the barometer requires a thinner structural layer as a deformable film to improve sensing sensitivity, while the accelerometer (or other inertial elements) requires a thicker structural layer as a sensing mass to achieve high sensitivity. Furthermore, the barometer requires an operating circumstance with a higher degree of vacuum to reduce an effect of temperature when measuring an absolute pressure. However, for the accelerometer, an operating circumstance with an excessive degree of vacuum leads to an unstable measuring output. Therefore, these sensors require different gas pressures in the operating circumstance.

In an embodiment of the disclosure, a micro-electromechanical apparatus includes a substrate, a first cover, a sensing unit and a second cover. The substrate has a first surface, the first cover is disposed on the substrate, and the first cover and the substrate define a first hermetically sealed chamber. The sensing unit includes a movable mass suspended over the substrate. The second cover is disposed on the substrate, and the second cover and the substrate define a second hermetically sealed chamber. The sensing unit is disposed outside the second hermetically sealed chamber, and the sensing unit is enclosed by the first hermetically sealed chamber.

In an embodiment of the disclosure, a micro-electromechanical apparatus includes a substrate, a first cover, a sensing unit and a second cover. The substrate has a first surface, the first cover is disposed on the substrate, and the first cover and the substrate define a first hermetically sealed chamber. The sensing unit includes a movable mass suspended over the substrate. The second cover is disposed on the substrate, and the second cover and the substrate define a second hermetically sealed chamber. In the embodiment, the sensing unit is disposed outside the second hermetically sealed chamber, the sensing unit and the second cover are enclosed by the first hermetically sealed chamber, and a gas pressure of the first hermetically sealed chamber is different from a gas pressure of the second hermetically sealed chamber.

In an embodiment of the disclosure, a micro-electromechanical apparatus includes a substrate, a first cover, a sensing unit and a second cover. The substrate has a first surface, the first cover is disposed on the substrate, and the first cover and the substrate define a first hermetically sealed chamber. The sensing unit includes a movable mass suspended over the substrate. The second cover is disposed on the substrate, and the second cover and the substrate define a second hermetically sealed chamber. In the embodiment, the sensing unit is disposed outside the second hermetically sealed chamber, and the sensing unit and the second cover are enclosed by the first hermetically sealed chamber. In addition, a distance from a lower surface of the movable mass to the first surface is substantially equal to a distance from a lower surface of a top wall of the second cover to the first surface, and a thickness of the movable mass is substantially equal to a thickness of the second cover.

In an embodiment of the disclosure, a micro-electromechanical apparatus includes a substrate, a first cover, a sensing unit and a second cover. The substrate has a first surface and includes a film and a through hole. The first cover is disposed on the substrate, and the first cover and the substrate define a first hermetically sealed chamber. The sensing unit includes a movable mass suspended over the substrate. The second cover is disposed on the substrate, and the second cover and the substrate define a second hermetically sealed chamber. In the embodiment, the sensing unit is disposed outside the second hermetically sealed chamber, and the sensing unit and the second cover are enclosed by the first hermetically sealed chamber. An upper surface of the film is exposed in the second hermetically sealed chamber, and a lower surface of the film covers the through hole.

In an embodiment of the disclosure, a method for manufacturing a micro-electromechanical apparatus includes the following steps. Firstly, a first substrate is provided, and a stationary electrode is formed on the first substrate. And, a second substrate is provided and etched to form a plurality of protrusions and a plurality of recesses. Next, the second substrate is bonded to the first substrate to form a second hermetically sealed chamber. The second substrate is then etched to form a sensing unit and a second cover covering the second hermetically sealed chamber. The sensing unit of this embodiment includes at least one movable mass suspended over the stationary electrode. Then, a first cover is bonded to the first surface of the first substrate to form a first hermetically sealed chamber. A gas pressure of the first hermetically sealed chamber is a first gas pressure, a gas pressure of the second hermetically sealed chamber is a second gas pressure, and the first gas pressure is different form the second gas pressure. The sensing unit and the second cover are enclosed by the first hermetically sealed chamber, and the sensing unit is disposed outside the second hermetically sealed chamber.

Accordingly, the disclosure provides a structural design and a manufacturing method for integrating at least two kinds of micro-electromechanical sensing elements in a single process platform. The at least two kinds of micro-electromechanical sensing elements are integrated into a single apparatus by overcoming the differences in operating circumstance and structural design between different sensing elements. For example, the micro-electromechanical apparatus of the disclosure provides the first hermetically sealed chamber and the second hermetically sealed chamber independent from each other and having different gas pressures to be adaptable to operating circumstances of the aforementioned barometer and accelerometer. Furthermore, through the design of hermetically sealed encapsulation, electrical conductive wires and electrodes of the sensing elements are enclosed in the hermetically sealed chamber to prevent the electrical conductive wires and the electrodes from being corroded by moisture and chemical substances.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIGS. 2-16 illustrate a method of manufacturing a micro-electromechanical apparatus of an embodiment of the disclosure.

DETAILED DESCRIPTION OF DISCLOSED EMBODIMENTS

Figure 1:
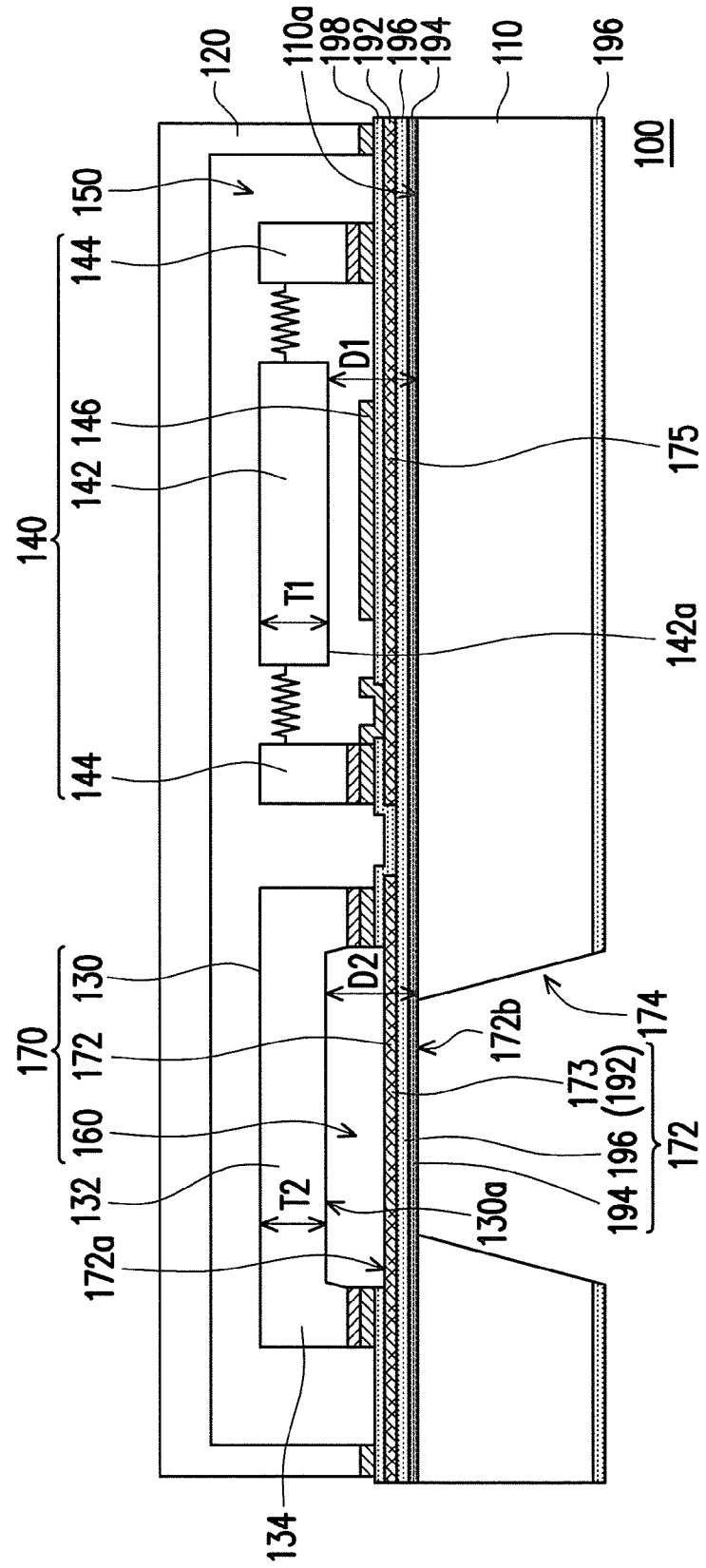
FIG. 1 is a schematic diagram of a micro-electromechanical apparatus of an embodiment of the disclosure.

FIG. 1 is a schematic diagram of a micro-electromechanical apparatus 100 being adapted to measuring a pressure and an inertial physical quantity simultaneously according to an embodiment of the disclosure. Here, the pressure may be a hydraulic pressure or a gas pressure, and the inertial physical quantity is a physical quantity measured by utilizing inertia of a mass, such as acceleration, angular velocity, magnetic forces (such as earth's magnetism), resonant frequency, etc. In other words, the micro-electromechanical apparatus 100 is capable of integrating at least two kinds of sensors into one micro-electromechanical apparatus according to different purposes. For example, in an embodiment, a barometer and an accelerometer may be integrated into one micro-electromechanical apparatus for detecting a tire pressure of a vehicle. In another embodiment, a barometer and a gyroscope (or a magnetometer) may also be integrated into one micro-electromechanical apparatus.

As shown in FIG. 1, the micro-electromechanical apparatus 100 includes a substrate 110, a first cover 120, a second cover 130 and a sensing unit 140. The substrate 110 has a first surface 110a, the first cover 120 is disposed on the substrate 110, and the first cover 120 and the substrate 110 define a first hermetically sealed chamber 150. The second cover 130 is disposed on the substrate 110, and the second cover 130 and the substrate 110 define a second hermetically sealed chamber 160. Here, the second cover 130 has a top wall 132 and a side wall 134 connecting and surrounding the top wall 132. In addition, the aforementioned "the first cover 120 is disposed on the substrate 110" may be interpreted as: the first cover 120 is directly disposed on the substrate 110 without any material layers such as electrical insulation layers or electrical conductive layers therebetween. Alternatively, the first cover 120 may be disposed on the substrate 110 with other material layers therebetween, such as the second electrical insulation layer 198, the electrical conductive layer 192 or the semiconductor layer 194, etc., as described in the following paragraphs.

The sensing unit 140 includes a movable mass 142 suspended over the substrate 110, and the sensing unit 140 is disposed outside the second hermetically sealed chamber 160. Here, since the movable mass 142 sensing unit is suspended over the substrate 110, there may not be any other layer between the movable mass 142 sensing unit and the substrate 110. The first hermetically sealed chamber 150 encloses at least the sensing unit 140, or encloses the sensing unit 140 and the second cover 130 together. In other words, the first cover 120 may cover the second cover 130 and the sensing unit 140 together, as shown in this embodiment. Alternatively, in other embodiments not shown herein, the first cover 120 may only cover the sensing unit 140, while the second cover 130 is located outside the first cover 120.

In this embodiment, the first hermetically sealed chamber 150 and the second hermetically sealed chamber 160 are independent from each other, so as to provide different operating circumstances. Taking a design integrating a barometer and an accelerometer as an example, the first hermetically sealed chamber 150 and the second hermetically sealed chamber 160 have different gas pressures, so as to provide desired operating circumstances of the barometer and the accelerometer. However, types of the sensing elements are not limited to those described in this embodiment. With reference to the description provided herein, people having ordinary skill in the art can modify the disclosed structure without departing from the spirit of the disclosure. For example, the accelerometer may be replaced by a gyroscope, or a magnetometer, or an oscillator, or a combination of any two or more elements mentioned above.

Details about the specific structure are described below with reference to FIG. 1. The sensing unit 140 may be an accelerometer, including anchors 144, a movable mass 142 and a stationary electrode 146. The movable mass 142 is mechanically coupled to the anchors 144 and has at least one degree of freedom. A capacitor is formed by the stationary electrode 146 and the movable mass 142. When measuring acceleration in a specific axial direction by using the micro-electromechanical apparatus 100, the capacitance between the movable mass 142 and the stationary electrode 146 varies in accordance with motion of the movable mass 142. Therefore, a value of acceleration can be calculated according to variation of the capacitance by using an application-specific integrated circuit (ASIC). Since the sensing unit 140 is enclosed by the first hermetically sealed chamber 150, a specific gas pressure of the first hermetically sealed chamber 150 suitable for measuring acceleration can be chosen, so as to provide a correct and accurate measuring result.

On the other hand, the second hermetically sealed chamber 160 of this embodiment may have a higher degree of vacuum such as high vacuum or ultra-high vacuum, so as to provide an operational circumstance with a gas pressure suitable for barometer to measure an absolute pressure. Alternatively, the second hermetically sealed chamber 160 may have a specific gas pressure value, so as to provide an operational circumstance suitable for barometer to measure a relative pressure. The substrate 110 of this embodiment includes a film 172 and a through hole 174 penetrating the substrate 110. In addition, an upper surface 172a of the film 172 is electrical conductive and exposed in the second hermetically sealed chamber 160. A lower surface 172b of the film 172 covers the through hole 174 and communicates with the exterior gas via the through hole 174. The second cover 130, the film 172 and the second hermetically sealed chamber 160 are adapted to measuring an outside gas pressure.

In this embodiment, the substrate 110 has a multi-layer structure to form the film 172 and other elements, such as electrodes or wires. More specifically, the substrate 110 includes the electrical conductive layer 192, the semiconductor layer 194, a first electrical insulation layer 196 disposed between the electrical conductive layer 192 and the semiconductor layer 194, and the first electrical insulation layer 196 at the bottom of the substrate 110. The film 172 of this embodiment is formed by the multi-layer structure constituted by a portion of the electrical conductive layer 192, a portion of the semiconductor layer 194 and a portion of the first electrical insulation layer 196, for example. The portion of the electrical conductive layer 192 is exposed in the second hermetically sealed chamber 160. The portion of the semiconductor layer 194 covers the through hole 174. The portion of the first electrical insulation layer 196 is disposed between the portion of the electrical conductive layer 192 and the portion of the semiconductor layer 194. Furthermore, the electrical conductive layer 192 is further covered by the second electrical insulation layer 198 to isolate the electrical conductive layer 192 from the stationary electrode 146 of the sensing unit 140. In other words, the electrical conductive layer 192 is disposed between the first electrical insulation layer 196 and the second electrical insulation layer 198, the stationary electrode 146 is disposed on the second electrical insulation layer 198, and the second electrical insulation layer 198 exposes the portion of the electrical conductive layer 192 in the second hermetically sealed chamber 160.

When the aforementioned substrate 110 is a semiconductor substrate, an ion implant process is performed to the substrate 110 to form the semiconductor layer 194. The semiconductor layer 194 may be a P-type semiconductor layer or an N-type semiconductor layer. The type of the semiconductor layer 194 can be determined by the type of the substrate 110. For instance, when the substrate 110 is an N-type semiconductor substrate, the semiconductor layer 194 can be a P-type semiconductor layer. When the substrate 110 is a P-type semiconductor substrate, the semiconductor layer 194 can be an N-type semiconductor layer. Furthermore, when the substrate 110 is a CMOS IC chip, the micro-electromechanical apparatus 100 becomes a vertical integrated micro-electromechanical apparatus.

Accordingly, in this embodiment, since the portion of the electrical conductive layer 192 of the film 172 is isolated by the semiconductor layer 194 and the first electrical insulation layer 196, the electrical conductive layer 192 can be prevented from corrosion or oxidation caused by outside moisture or chemical substance. Moreover, the electrical conductive layer 192 can be further used to form embedded electrical trace 175 of the micro-electromechanical apparatus 100. Therefore, no matter the electrical conductive layer 192 serves as the movable electrode 173 or serves as the embedded electrical trace 175 of the micro-electromechanical apparatus 100, the movable electrode 173 or the embedded electrical trace 175 can be effectively protected. In addition, since the first cover 120 covers the film 172 and the movable mass 142, the first cover 120 may be electrical conductive and electrically connected to an electrical ground layer (not shown) through the electrical conductive layer 192, to prevent the barometer 170 and the sensing unit 140 from generating an error signal due to outside electromagnetic interference.

Moreover, the film 172 can be formed of three material layers to adjust a stiffness of the film 172. Films differing in stiffness are adaptable to pressure measurements in different circumstances. For example, films of a tire gauge and a barometer have different stiffness. More specifically, the electrical conductive layer 192 can be formed of polysilicon. The semiconductor layer 194 can be a P-type semiconductor layer including boron-doped silicon. A material of the first electrical insulation layer 196 may be silicon nitride. Since a CTE (coefficient of thermal expansion) mismatch among the three material layers 192, 194, and 196 is small, a thermal stress generated in the film 172 can be reduced. Furthermore, since the film 172 formed of the three material layers has a high peeling strength, the material layers can be effectively prevented from being peeled from each other due to stress, thereby improving the reliability of the micro-electromechanical apparatus 100.

A material of the stationary electrode 146 of the sensing unit 140 is copper or other electrical conductive materials, for example. In this embodiment, the stationary electrode 146 and the electrical conductive layer 192 of the film 172 are different material layers. In other words, the stationary electrode 146 and the electrical conductive layer 192 are not coplanar with each other.

As described above, the second electrical insulation layer 198 is located between the stationary electrode 146 and the electrical conductive layer 192, and a material of the second electrical insulation layer 198 may be silicon nitride. The three-layer structure formed of copper/silicon nitride/polysilicon can improve the flexibility of electrical trace layout and substrate bonding process. For example, the electrical conductive layer 192 may form an electrical trace under the second electrical insulation layer 198, and then the first cover 120 and the substrate 110 can be bonded with each other by different bonding methods, such as glass frit bonding or metal bonding. In addition, the movable mass 142 and the second cover 130 of this embodiment may be formed of the same device material layer (e.g., a semiconductor layer) by the same manufacturing process. Therefore, a distance D1 from a lower surface 142a of the movable mass 142 to a first surface 110a of the substrate 110 is substantially equal to a distance D2 from a lower surface 130a of the top wall 132 of the second cover 130 to the first surface 110a, and a thickness T1 of the movable mass 142 is substantially equal to a thickness T2 of the second cover 130.

FIGS. 2-16 illustrate a method of manufacturing the micro-electromechanical apparatus 100 according to an embodiment of the disclosure. In this embodiment, the same or similar reference numbers are used herein to represent the same or similar components and specifically illustrate the manufacturing process, rather than define or limit the technical features of the disclosure. People having ordinary skill in the art may, based on the level of the current technology, modify, replace or omit the materials, processing conditions, or orders of steps of relevant processes according to the following descriptions without departing from the spirit of the disclosure.

Figure 2:
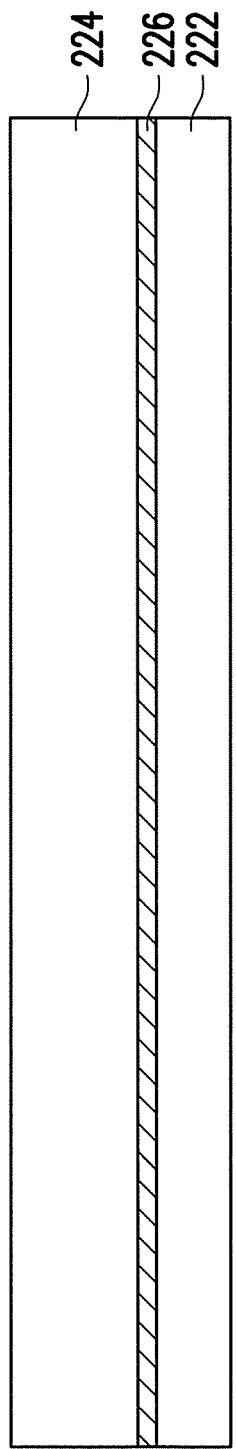
Figure 3:
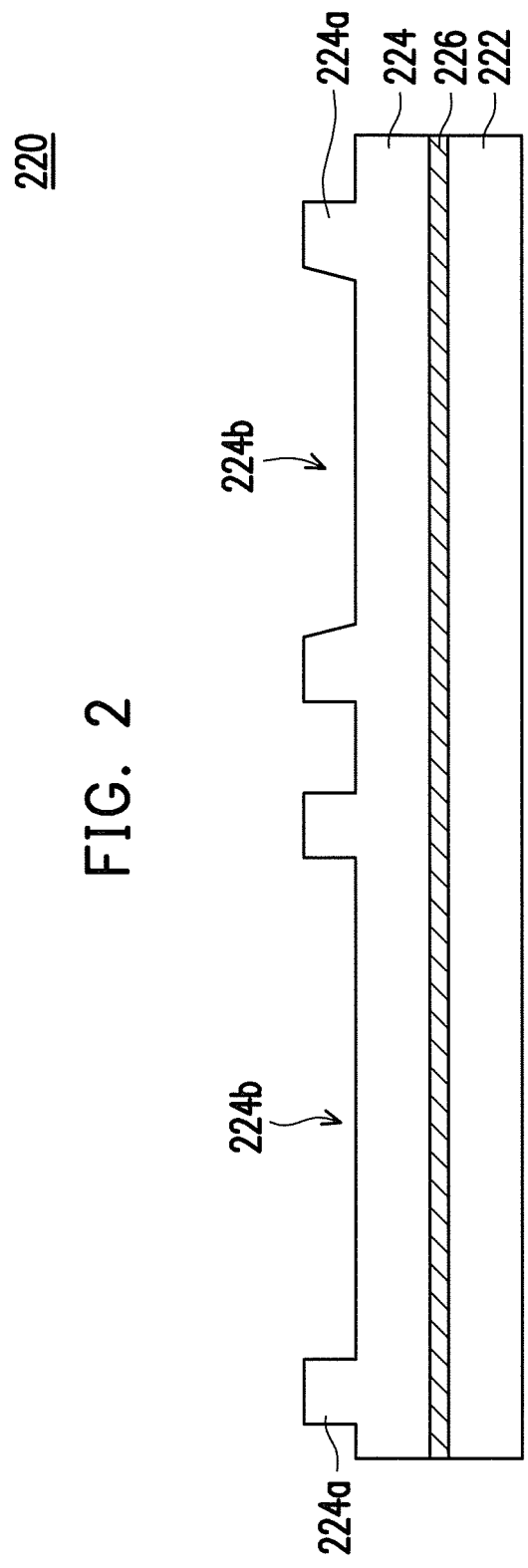
Figure 4:
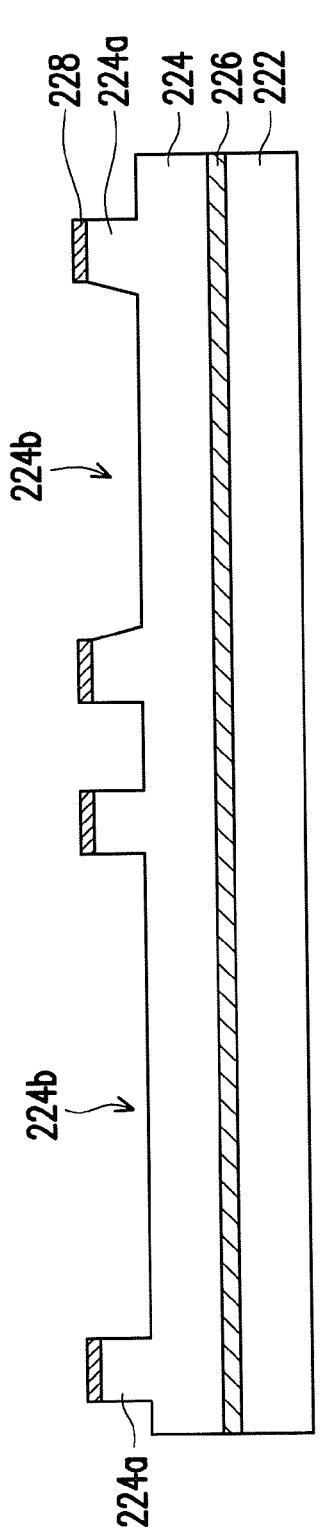

Firstly, as shown in FIG. 2, a second substrate 220, such as an SOI (Silicon on Insulator) wafer, is provided. The second substrate 220 includes a handle layer 222, a device layer 224 and an electrical insulation layer 226 between the handle layer 222 and the device layer 224. Here, a material of the handle layer 222 and the device layer 224 is silicon, and a material of the electrical insulation layer 226 is silicon oxide ($SiO_2$). Then, as shown in FIG. 3, a portion of the device layer 224 is removed by etching or other patterning processes, so as to form a plurality of protrusions 224a and a plurality of recesses 224b on the device layer 224. In addition, as shown in FIG. 4, an electrical conductive bonding layer 228 is formed on a top surface of the protrusions 224a.

Figure 5:
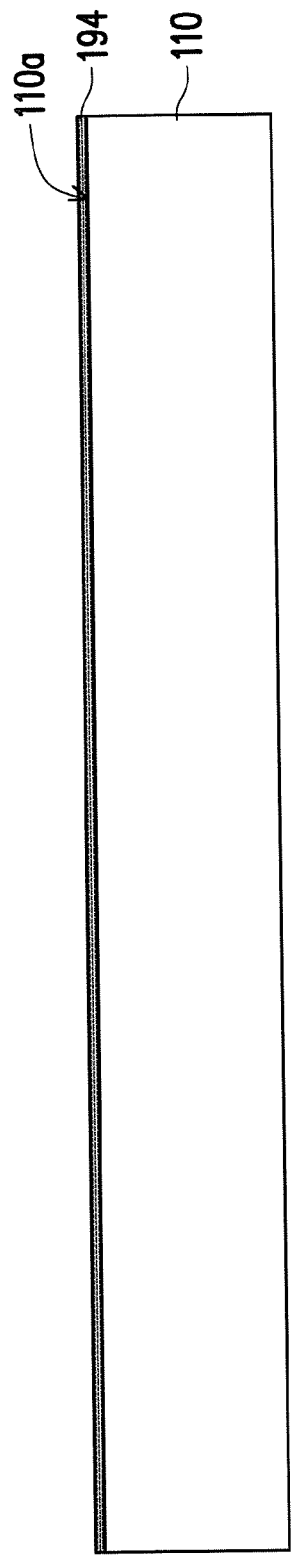
Figure 6:
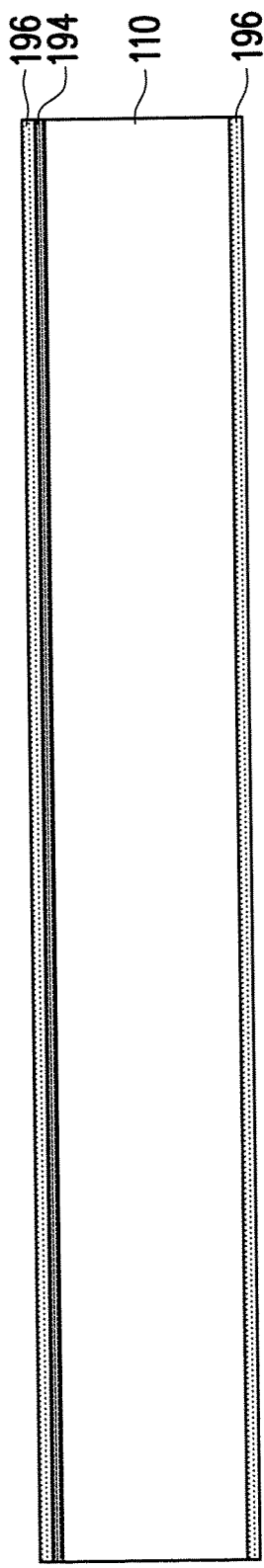
Figure 7:
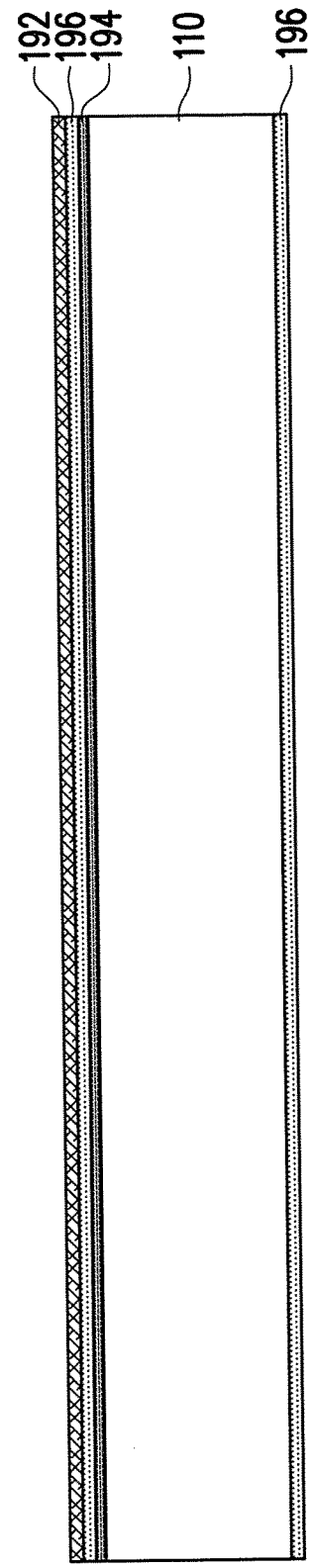

Next, referring to FIG. 5, the first substrate 110 is provided, and an ion implant process is performed to the surface 110a of the first substrate 110 to form the semiconductor layer 194. Here, the first substrate 110 is an N-type semiconductor substrate, for example, and the ion implant process that is performed is a P-type ion implant process, for example, for forming the P-type semiconductor layer 194. Alternatively, if the first substrate 110 is a P-type semiconductor substrate, then an N-type ion implant process can be performed to form the N-type semiconductor layer 194. Then, as shown in FIG. 6, a silicon nitride deposition process is performed on the semiconductor layer 194 to form the first electrical insulation layer 196. In the step of FIG. 6, another first electrical insulation layer 196 may be formed on a bottom surface of the substrate 110 by the deposition of silicon nitride. And, as shown in FIG. 7, a poly-silicon deposition process is performed on the first electrical insulation layer 196 to form the electrical conductive layer 192.

Then, as shown in FIG. 8, the electrical conductive layer 192 is patterned by etching or other applicable methods to foam a plurality of trenches 192a. The trenches 192a penetrate the electrical conductive layer 192 to the first electrical insulation layer 196 to define the movable electrode 173 and the embedded electrical trace 175. The defined movable electrode 173 may be circular, square or other shapes.

Figure 10:
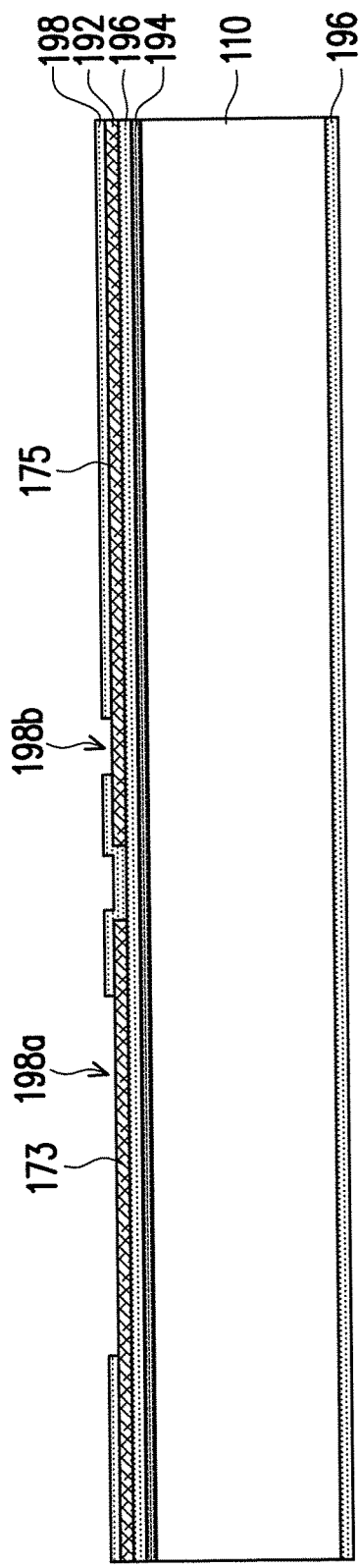

Then, as shown in FIG. 9, a silicon nitride deposition process is performed on the electrical conductive layer 192 to form the second electrical insulation layer 198. More specifically, the second electrical insulation layer 198 covers the movable electrode 173 and the electrical trace 175. Furthermore, the second electrical insulation layer 198 covers the first electrical insulation layer 196 exposed by the trenches 192a. And, as shown in FIG. 10, the second electrical insulation layer 198 is patterned by etching or other applicable methods, so as to form an opening 198a exposing the movable electrode 173 and a hole 198b connecting the electrical conductive layer 192.

Figure 11:
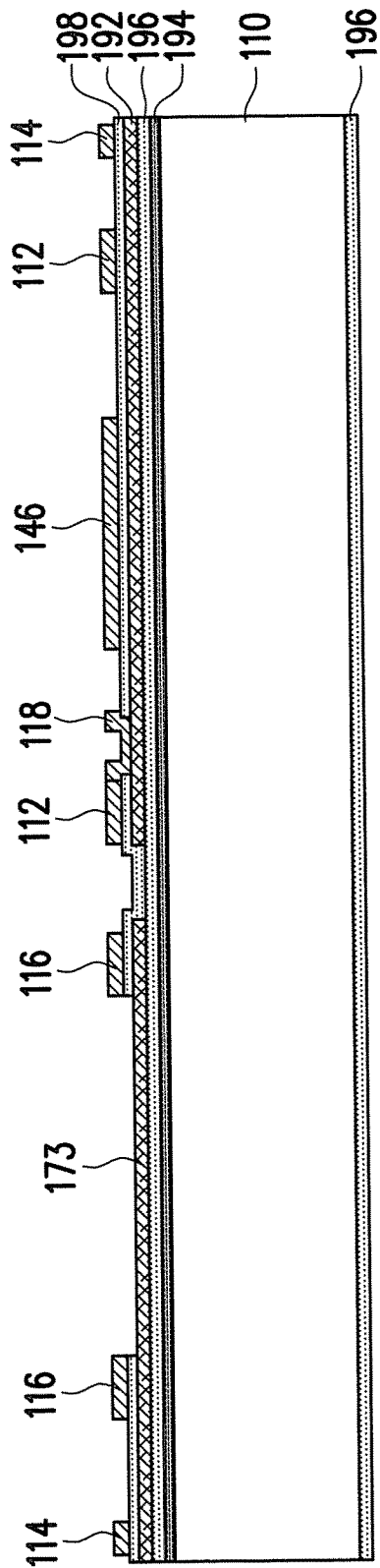

Next, as shown in FIG. 11, a patterned metal layer is formed. A material of the patterned metal layer is copper or other metals, for example. More specifically, an electrode material layer (e.g., copper layer) is formed on the first substrate 110 by deposition first, and then the electrode material layer is patterned by etching or other applicable methods, so as to form the stationary electrode 146, a plurality of electrical conductive bonding portions 112, a first electrical conductive sealing ring 114 and a second electrical conductive sealing ring 116 on the second electrical insulation layer 198. Meanwhile, an electrical conductive via 118 is formed in the hole 198b (as shown in FIG. 10) to connect the electrical conductive bonding portion 112 and the electrical conductive layer 192. In this way, the electrical conductive bonding portion 112 is electrically connected to the electrical conductive layer 192.

Figure 12:
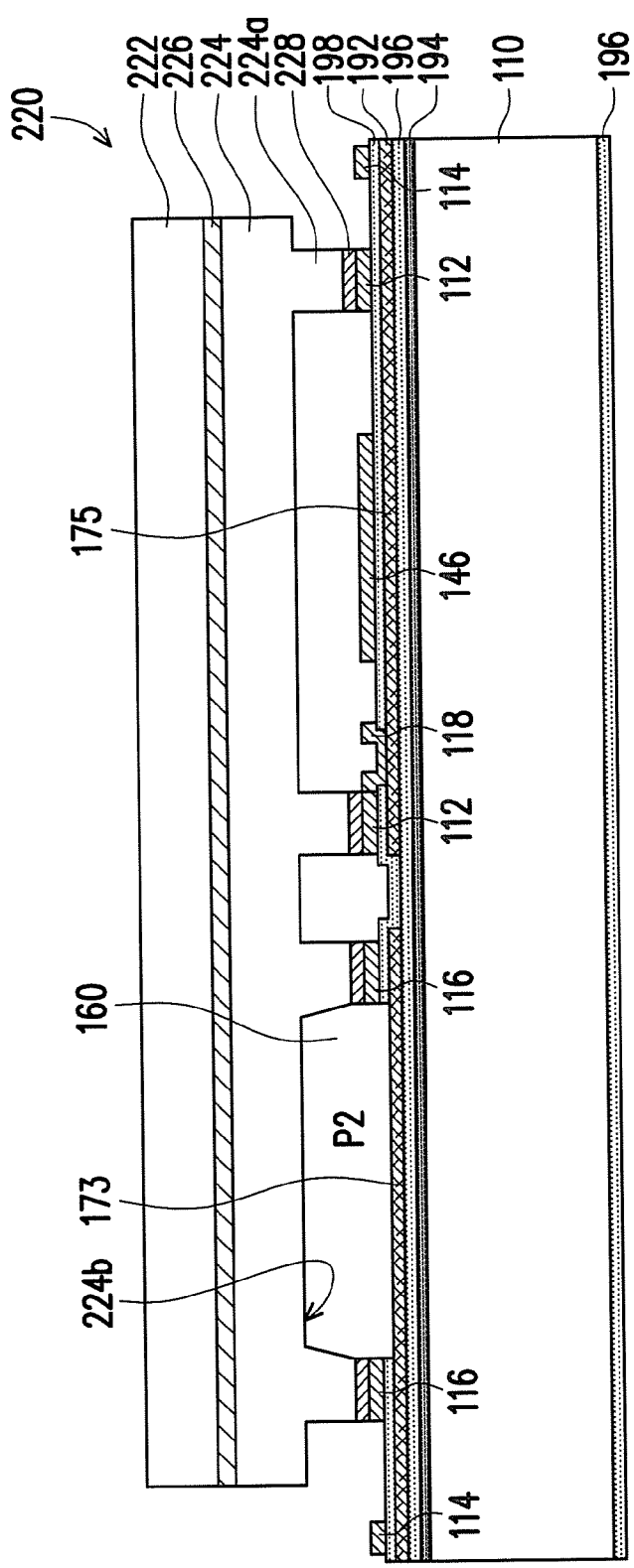

Then, as shown in FIG. 12, the second substrate 220 is bonded to the first substrate 110. In addition, the electrical conductive bonding layer 228 is correspondingly connected to the electrical conductive bonding portion 112 and the second electrical conductive sealing ring 116. Meanwhile, the second hermetically sealed chamber 160 is formed between the first substrate 110 and the second substrate 220, and a gas pressure of the second hermetically sealed chamber 160 is a gas pressure P2 in a circumstance of the bonding process. In addition to the second electrical conductive sealing ring 116 on the first substrate 110, it is noted that in the process of removing the portion of the device layer 224 as shown in FIG. 3, shapes and locations of the recesses 224b are taken into consideration form the complete second hermetically sealed chamber 160. For example, the recess 224b is formed on a location corresponding to the second hermetically sealed chamber 160, such that the recess 224b and a space surrounded by the second electrical conductive sealing ring 116 together form the second hermetically sealed chamber 160 after the second substrate 220 is bonded to the first substrate 110.

Figure 13:
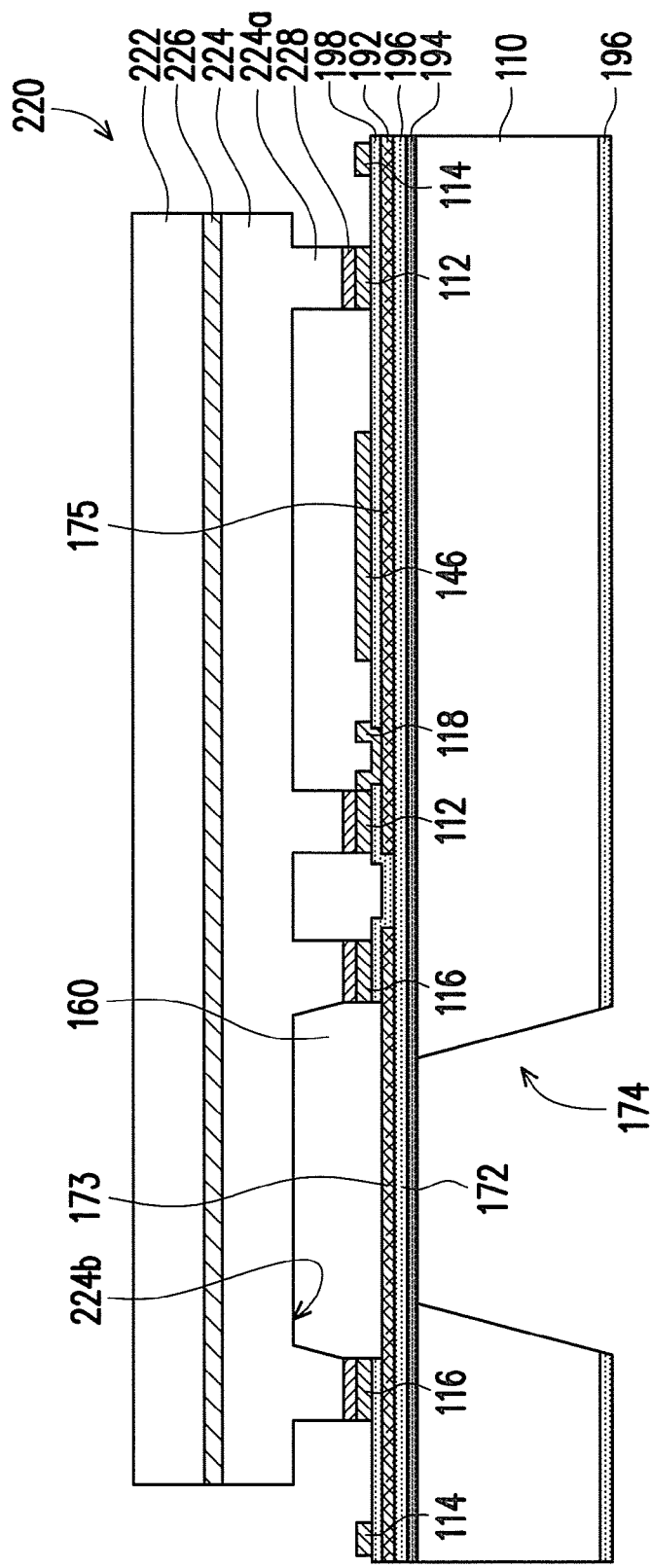

Then, as shown in FIG. 13, a back etching process is performed to the first substrate 110 by using a potassium hydroxide (KOH) solution, for example, to etch the bottom of the first substrate 110 and form the through hole 17 penetrating the first substrate 110. The through hole 174 exposes a portion of the P-type semiconductor layer 194. Thus, the film 172 is formed.

Figure 14:
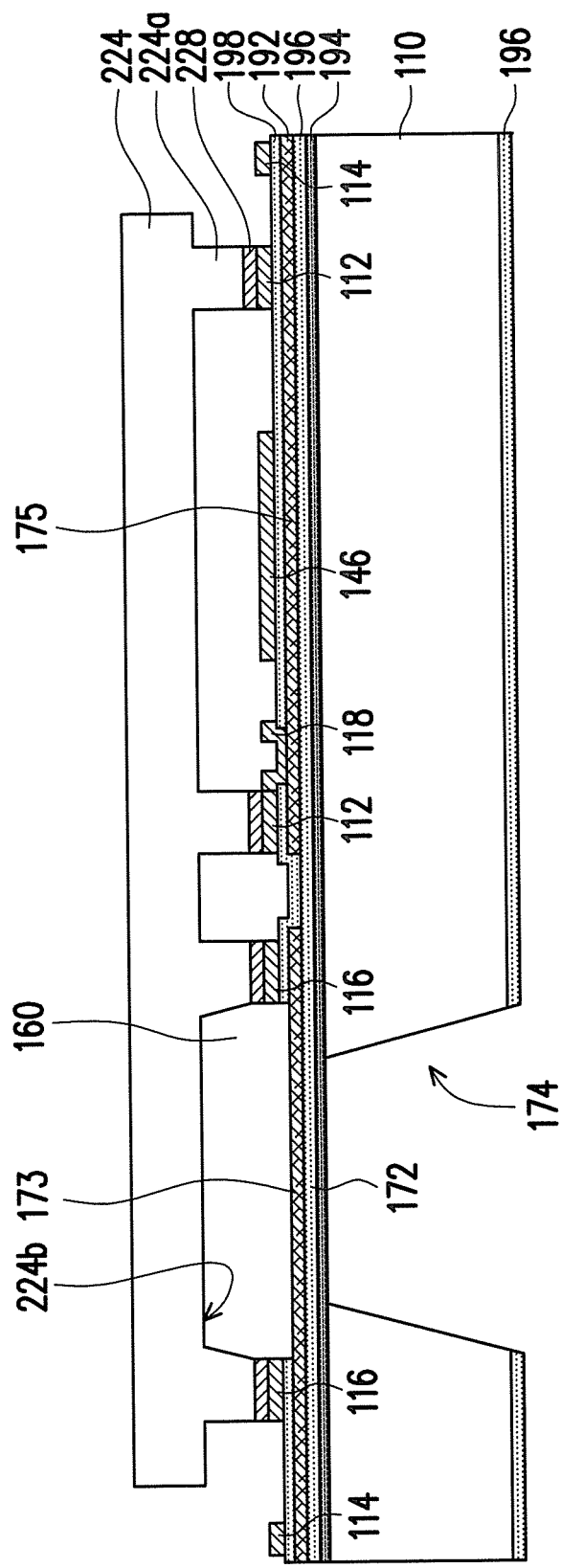
Figure 15:
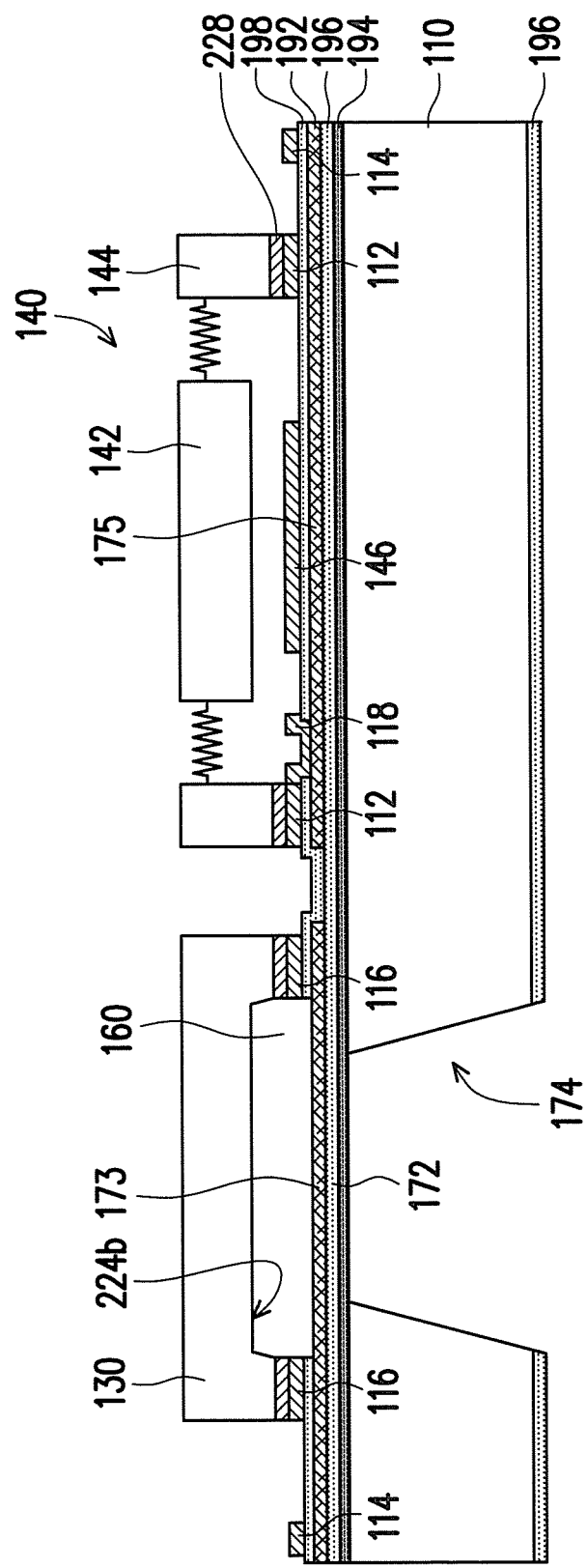

Next, as shown in FIG. 14, the handle layer 222 and the electrical insulation layer 226 of the second substrate 220 are removed. Then, as shown in FIG. 15, a portion of the device layer 224 is removed by etching or other patterning processes, so as to define the second cover 130, the movable mass 142 of the sensing unit 140, and the anchors 144, etc.

Figure 16:
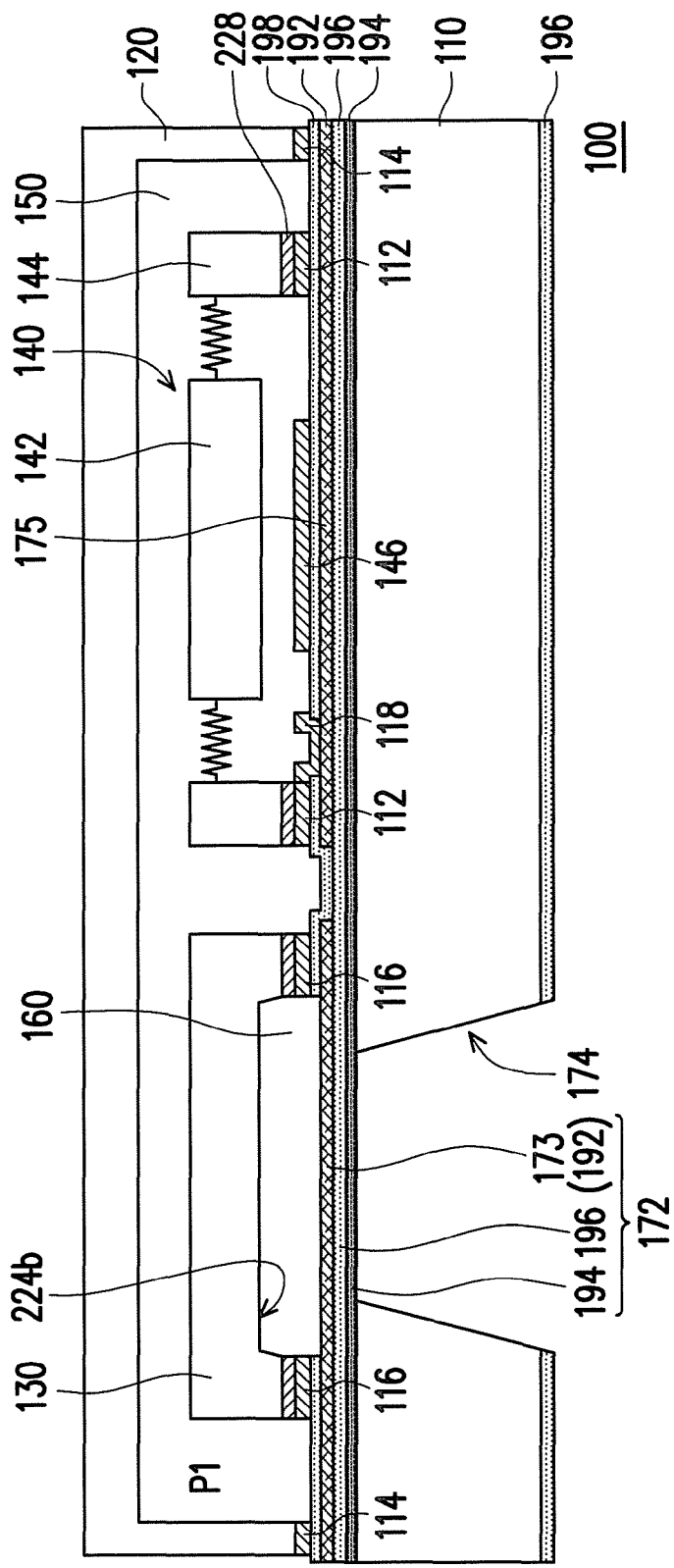

Then, as shown in FIG. 16, the first cover 120 is bonded to the first electrical conductive sealing ring 114 on the first substrate 110 to form the first hermetically sealed chamber 150. A gas pressure of the first hermetically sealed chamber 150 is a gas pressure P1 of a circumstance of performing the bonding process. The manufacture of the micro-electromechanical apparatus 100 is almost completed. In this step, the first cover 120 may cover the second cover 130 and the sensing unit 140 together. In other words, the second cover 130 and the sensing unit 140 are located in the first hermetically sealed chamber 150. Alternatively, in other embodiments not shown herein, the first cover 120 may cover the sensing unit 140 only, and the second cover 130 is located outside the first cover 120.

Accordingly, in this embodiment, the gas pressure P1 of the first hermetically sealed chamber 150 and the gas pressure P2 of the second hermetically sealed chamber 160 can be determined by the gas pressure of the circumstance of performing the bonding process as shown in FIG. 16 and by the gas pressure of the circumstance of performing the bonding process as shown in FIG. 12 respectively. Therefore, the method for manufacturing the micro-electromechanical apparatus 100 can provide the first hermetically sealed chamber 150 and the second hermetically sealed chamber 160 with the same or different gas pressures according to functions of different sensing elements. In this way, sensing elements such as a barometer, an accelerometer, a gyroscope, a magnetometer or an oscillator can be integrated into a single micro-electromechanical apparatus.

In addition, the film 172 includes a portion of the electrical conductive layer 192, a portion of the semiconductor layer 194 and a portion of the first electrical insulation layer 196, so the portion of the electrical conductive layer 192 is isolated by the semiconductor layer 194 and the first electrical insulation layer 196. Thus, the electrical conductive layer 192 can be prevented from the corrosion or oxidation caused by outside moisture or chemical substances. Hence, the film 172 formed of multiple materials provides superior protection to the movable electrode 173 or the electrical traces 175. And, during the manufacturing process of the film 172, the material or thickness of the electrical conductive layer 192, the semiconductor layer 194 and the first electrical insulation layer 196 can be changed to adjust the stiffness of the film 172. Different films 172 with different stiffness are applicable in pressure measurements in different circumstances, such as applications in the tire pressure gauge for monitoring the tire pressure or the barometer for 3D navigation.

On the other hand, the device layer 214 is patterned in the manufacturing method of this embodiment to form the movable mass 142 and the second cover 130 simultaneously. Thus, height and thickness of the movable mass 142 is substantially equal to those of the second cover 130. More specifically, as shown in FIG. 1, the distance D1 from the lower surface 142a of the movable mass 142 to the first surface 110a of the substrate 110 is substantially equal to the distance D2 from the lower surface 130a of the top wall 132 of the second cover 130 to the first surface 110a, and the thickness T1 of the movable mass 142 is substantially equal to the thickness T2 of the second cover 130.

Although the disclosure has been described with reference to the above embodiments, it will be apparent to one of the ordinary skill in the art that modifications to the described embodiments may be made without departing from the spirit of the disclosure. Accordingly, the scope of the disclosure is defined by the attached claims not by the above detailed descriptions.

What is claimed is:

1. A micro-electromechanical apparatus, being adapted to measuring a pressure and an inertial physical quantity, the micro-electromechanical apparatus comprising:
    a substrate, having a first surface;
    a first cover, disposed on the substrate and having a top wall and a side wall, wherein the top wall and the side wall of the first cover are integrally formed, and the side wall of the first cover is connected to the substrate so the first cover and the substrate define a first hermetically sealed chamber;
    a sensing unit, comprising a movable mass suspended over the substrate; and
    a second cover, disposed on the substrate, wherein the second cover and the substrate define a second hermetically sealed chamber, wherein the first cover covers a lateral portion and an upper surface of the movable mass, the side wall of the first cover surrounds the movable mass, and the sensing unit is enclosed by the first hermetically sealed chamber and is disposed outside the second hermetically sealed chamber.

2. The micro-electromechanical apparatus of claim 1, wherein a gas pressure of the first hermetically sealed chamber is different from a gas pressure of the second hermetically sealed chamber.

3. The micro-electromechanical apparatus of claim 2, wherein a distance from a lower surface of the movable mass to the first surface is substantially equal to a distance from a lower surface of a top wall of the second cover to the first surface, and a thickness of the movable mass is substantially equal to a thickness of the second cover.

4. The micro-electromechanical apparatus of claim 3, wherein the substrate further comprises a film and a through hole, an upper surface of the film is electrical conductive and exposed in the second hermetically sealed chamber, and a lower surface of the film directly covers the through hole to communicates with the exterior gas via the through hole.

5. The micro-electromechanical apparatus of claim 4, wherein the substrate further comprises:
    a semiconductor layer, disposed on the first surface;
    a first electrical insulation layer, covering the semiconductor layer;
    an electrical conductive layer, disposed on the first electrical insulation layer;
    a second electrical insulation layer, covering the electrical conductive layer; and
    a stationary electrode, disposed on the second electrical insulation layer.

6. The micro-electromechanical apparatus of claim 5, wherein the film comprises:
    a portion of the electrical conductive layer, exposed in the second hermetically sealed chamber;
    a portion of the semiconductor layer, covering the through hole; and
    a portion of the first electrical insulation layer, disposed between the portion of the electrical conductive layer and the portion of the semiconductor layer.

7. The micro-electromechanical apparatus of claim 6, wherein a material of the stationary electrode comprises copper, and a material of the electrical conductive layer comprises poly-silicon.

8. The micro-electromechanical apparatus of claim 4, wherein the second cover, the film and the second hermetically sealed chamber are adapted to measuring a gas pressure.

9. The micro-electromechanical apparatus of claim 1, wherein the sensing unit comprises at least one of an accelerometer, a gyroscope, and an oscillator.

10. A micro-electromechanical apparatus, comprising:
    a substrate, having a first surface;
    a first cover, disposed on the substrate and having a top wall and a side wall, wherein the top wall and the side wall of the first cover are integrally formed, and the side wall of the first cover is connected to the substrate so the first cover and the substrate define a first hermetically sealed chamber; and
    a sensing unit, comprising a movable mass suspended over the substrate;
    a second cover, disposed on the substrate, wherein the second cover and the substrate define a second hermetically sealed chamber,
    wherein the first cover covers a lateral portion and an upper surface of the movable mass and the first cover covers a lateral portion and an upper surface of the second cover, the side wall of the first cover surrounds the movable mass and the second cover, the sensing unit and the second cover are enclosed by the first hermetically sealed chamber, the sensing unit is disposed outside the second hermetically sealed chamber, and a gas pressure of the first hermetically sealed chamber is different from a gas pressure of the second hermetically sealed chamber.

11. The micro-electromechanical apparatus of claim 10, wherein a distance from a lower surface of the movable mass to the first surface is substantially equal to a distance from a lower surface of a top wall of the second cover to the first surface, and a thickness of the movable mass is substantially equal to a thickness of the second cover.

12. The micro-electromechanical apparatus of claim 11, wherein the substrate further comprises a film and a through hole, an upper surface of the film is electrical conductive and exposed in the second hermetically sealed chamber, and a lower surface of the film directly covers the through hole to communicates with the exterior gas via the through hole.

13. The micro-electromechanical apparatus of claim 12, wherein the substrate further comprises:
 a semiconductor layer, disposed on the first surface;
 a first electrical insulation layer, covering the semiconductor layer;
 an electrical conductive layer, disposed on the first electrical insulation layer;
 a second electrical insulation layer, covering the electrical conductive layer; and
 a stationary electrode, disposed on the second electrical insulation layer.

14. The micro-electromechanical apparatus of claim 13, wherein the film comprises:
 a portion of the electrical conductive layer, exposed in the second hermetically sealed chamber;
 a portion of the semiconductor layer, covering the through hole; and
 a portion of the first electrical insulation layer, disposed between the portion of the electrical conductive layer and the portion of the semiconductor layer.

15. A micro-electromechanical apparatus, comprising:
a substrate, having a first surface;
a first cover, disposed on the substrate and having a top wall and a side wall, wherein the top wall and the side wall of the first cover are integrally formed, and the side wall of the first cover is connected to the substrate so the first cover and the substrate define a first hermetically sealed chamber;
a sensing unit, comprising a movable mass suspended over the substrate; and
a second cover, disposed on the substrate, wherein the second cover and the substrate define a second hermetically sealed chamber,
wherein the first cover covers a lateral portion and an upper surface of the movable mass and the first cover covers a lateral portion and an upper surface of the second cover, the side wall of the first cover surrounds the movable mass and the second cover, the sensing unit and the second cover are enclosed by the first hermetically sealed chamber, the sensing unit is disposed outside the second hermetically sealed chamber, a distance from a lower surface of the movable mass to the first surface is substantially equal to a distance from a lower surface of a top wall of the second cover to the first surface, and a thickness of the movable mass is substantially equal to a thickness of the second cover.

16. The micro-electromechanical apparatus of claim 15, wherein the substrate further comprises a film and a through hole, an upper surface of the film is electrical conductive and exposed in the second hermetically sealed chamber, and a lower surface of the film directly covers the through hole to communicates with the exterior gas via the through hole.

17. The micro-electromechanical apparatus of claim 16, wherein the substrate further comprises:
 a semiconductor layer, disposed on the first surface;
 a first electrical insulation layer, covering the semiconductor layer;
 an electrical conductive layer, disposed on the first electrical insulation layer;
 a second electrical insulation layer, covering the electrical conductive layer; and
 a stationary electrode, disposed on the second electrical insulation layer.

18. The micro-electromechanical apparatus of claim 17, wherein the film comprises:
 a portion of the electrical conductive layer, exposed in the second hermetically sealed chamber;
 a portion of the semiconductor layer, covering the through hole; and
 a portion of the first electrical insulation layer, disposed between the portion of the electrical conductive layer and the portion of the semiconductor layer.

19. A micro-electromechanical apparatus, comprising:
a substrate, having a first surface, comprising:
 a film; and
 a through hole;
a first cover, disposed on the substrate and having a top wall and a side wall, wherein the top wall and the side wall of the first cover are integrally formed, and the side wall of the first cover is connected to the substrate so the first cover and the substrate define a first hermetically sealed chamber;
a sensing unit, comprising a movable mass suspended over the substrate; and
a second cover, disposed on the substrate, wherein the second cover and the substrate define a second hermetically sealed chamber,
wherein the first cover covers a lateral portion and an upper surface of the movable mass and the first cover covers a lateral portion and an upper surface of the second cover, the side wall of the first cover surrounds the movable mass and the second cover, the sensing unit and the second cover are enclosed by the first hermetically sealed chamber, the sensing unit is disposed outside the second hermetically sealed chamber, an upper surface of the film is exposed in the second hermetically sealed chamber, and a lower surface of the film covers the through hole.

20. The micro-electromechanical apparatus of claim 19, wherein the substrate further comprises:
 a semiconductor layer, disposed on the first surface;
 a first electrical insulation layer, covering the semiconductor layer;
 an electrical conductive layer, disposed on the first electrical insulation layer;
 a second electrical insulation layer, covering the electrical conductive layer; and
 a stationary electrode, disposed on the second electrical insulation layer.

21. The micro-electromechanical apparatus of claim 20, wherein the film comprises:
 a portion of the electrical conductive layer, exposed in the second hennetically sealed chamber;

a portion of the semiconductor layer, covering the through hole; and a portion of the first electrical insulation layer, disposed between the portion of the electrical conductive layer and the portion of the semiconductor layer.

22. The micro-electromechanical apparatus of claim 19, wherein a gas pressure of the first hermetically sealed chamber is different from a gas pressure of the second hermetically sealed chamber.

23. A method for manufacturing a micro-electromechanical apparatus, the method comprising:
    forming a stationary electrode on a first substrate;
    etching a second substrate to form a plurality of protrusions and a plurality of recesses;
    bonding he second substrate to the first substrate to form a second hermetically sealed chamber;
    etching the second substrate to form a sensing unit and a second cover covering the second hermetically sealed chamber, wherein the sensing unit comprises at least one movable mass suspended over the stationary electrode; and
    bonding a first cover to a first surface of the first substrate to form a first hermetically sealed chamber, wherein the first cover has a top wall and a side wall, the top wall and the side wall of the first cover are integrally formed, and the side wall of the first cover is connected to the substrate, and wherein the first cover covers a lateral portion and an upper surface of the movable mass, and the side wall of the first cover surrounds the movable mass,
    wherein a gas pressure of the first hermetically sealed chamber is different from a gas pressure of the second hermetically sealed chamber, the sensing unit and the second cover are enclosed by the first hermetically sealed chamber, and the sensing unit is disposed outside the second hermetically sealed chamber.

24. The method of claim 23, wherein forming the second cover and the movable mass comprises:
    making a distance from a lower surface of the movable mass to the first surface be substantially equal to a distance from a lower surface of a top wall of the second cover to the first surface, and making a thickness of the movable mass be substantially equal to a thickness of the second cover.

25. The method of claim 23, wherein providing the first substrate comprises:
    forming a film and a through hole on the first substrate, wherein the through hole penetrates the first substrate, and the film covers the through hole.

26. The method of claim 25, wherein forming the film comprises:
    forming a P-type semiconductor layer on the first surface of the first substrate;
    forming a first electrical insulation layer on the P-type semiconductor layer;
    forming an electrical conductive layer on the first electrical insulation layer;
    forming a second electrical insulation layer on the electrical conductive layer, wherein the second electrical insulation layer covers the first electrical insulation layer and the electrical conductive layer; and
    patterning the second electrical insulation layer to have a portion of the electrical conductive layer exposed in the second hermetically sealed chamber.

27. The method of claim 26, wherein forming the stationary electrode comprises:

forming an electrode material layer on the patterned second electrical insulation layer; and
    patterning the electrode material layer to form the stationary electrode.

28. The method of claim 23, wherein the second substrate comprises a device layer, a handle layer and an electrical insulation layer disposed between the device layer and the handle layer, and the method further comprises:
    etching the device layer to form the protrusions and the recesses; and
    forming an electrical conductive bonding layer on the protrusions.

29. The method of claim 28, wherein bonding the second substrate to the first substrate comprises:
    disposing the device layer of the second substrate to face the first substrate, and connecting the electrical conductive bonding layer to a plurality of electrical conductive bonding portions on the first substrate.

30. The method of claim 29, further comprising:
    removing the handle layer and the electrical insulation layer of the second substrate after bonding the second substrate to the first surface of the first substrate.

31. The method of claim 30, wherein forming the second cover and the sensing unit comprises etching the device layer of the second substrate.

32. A method for manufacturing a micro-electromechanical apparatus adapted to measure a pressure and an inertial physical quantity, the method comprising:
    forming a stationary electrode on a first substrate;
    etching a second substrate to form a plurality of protrusions and a plurality of recesses;
    bonding the second substrate to the first substrate to form a second hermetically sealed chamber;
    etching the second substrate to form a sensing unit and a second cover covering the second hermetically sealed chamber, wherein the sensing unit comprises at least one movable mass suspended over the stationary electrode; and
    bonding a first cover to a first surface of the first substrate to form a first hermetically sealed chamber, wherein the first cover has a top wall and a side wall, the top wall and the side wall of the first cover are integrally formed, and the side wall of the first cover is connected to the substrate, and wherein the first cover covers a lateral portion and an upper surface of the movable mass and the first cover covers a lateral portion and an upper surface of the second cover, the side wall of the first cover surrounds the movable mass and the second cover,
    wherein a gas pressure of the first hermetically sealed chamber is different from a gas pressure of the second hermetically sealed chamber, the sensing unit is enclosed by the first hermetically sealed chamber, and the sensing unit is disposed outside the second hermetically sealed chamber.

33. A method for manufacturing a micro-electromechanical apparatus, the method comprising:
    forming a stationary electrode on a first substrate;
    etching a second substrate to form a plurality of protrusions and a plurality of recesses;
    bonding the second substrate to the first substrate to form a second hermetically sealed chamber;
    etching the second substrate to form a sensing unit and a second cover covering the second hermetically sealed chamber, wherein the sensing unit comprises at least one movable mass suspended over the stationary electrode; and bonding a first cover to a first surface of the first substrate to form a first hermetically sealed chamber, wherein the first cover has a top wall and a side wall, the top wall and the side wall of the first cover are integrally formed, and the side wall of the first cover is connected to the substrate, and wherein the first cover covers a lateral portion and an upper surface of the movable mass and the first cover covers a lateral portion and an upper surface of the second cover, the side wall of the first cover surrounds the movable mass and the second cover, wherein a gas pressure of the first hermetically sealed chamber is different from a gas pressure of the second hermetically sealed chamber, the sensing unit and the second cover are enclosed by the first hermetically sealed chamber, the sensing unit is disposed outside the second hermetically sealed chamber, a distance from a lower surface of the movable mass to the first surface is substantially equal to a distance from a lower surface of a top wall of the second cover to the first surface, and a thickness of the movable mass is substantially equal to a thickness of the second cover.

34. A method for manufacturing a micro-electromechanical apparatus, the method comprising:

forming a stationary electrode on a first substrate, wherein the first substrate comprises a film and a through hole;

etching a second substrate to form a plurality of protrusions and a plurality of recesses;

bonding the second substrate to the first substrate to form a second hermetically sealed chamber;

etching the second substrate to form a sensing unit and a second cover covering the second hermetically sealed chamber, wherein the sensing unit comprises at least one movable mass suspended over the stationary electrode; and bonding a first cover to a first surface of the first substrate to form a first hermetically sealed chamber, wherein the first cover has a top wall and a side wall, the top wall and the side wall of the first cover are integrally formed, and the side wall of the first cover is connected to the substrate, and wherein the first cover covers a lateral portion and an upper surface of the movable mass and the first cover covers a lateral portion and an upper surface of the second cover, the side wall of the first cover surrounds the movable mass and the second cover, wherein a gas pressure of the first hermetically sealed chamber is different from a gas pressure of the second hermetically sealed chamber, the sensing unit and the second cover are enclosed by the first hermetically sealed chamber, the sensing unit is disposed outside the second hermetically sealed chamber, an upper surface of the film is exposed in the second hermetically sealed chamber, and a lower surface of the film covers the through hole.

* * * * *